United States Patent [19]

Zorinsky et al.

[11] Patent Number: 4,897,698
[45] Date of Patent: Jan. 30, 1990

[54] HORIZONTAL STRUCTURE THIN FILM TRANSISTOR

[75] Inventors: Eldon J. Zorinsky; David B. Spratt, both of Plano; James D. Guillory, Athens, all of Tex.

[73] Assignee: Texas Instruments Incorporated, Dallas, Tex.

[21] Appl. No.: 285,348

[22] Filed: Dec. 14, 1988

Related U.S. Application Data

[63] Continuation of Ser. No. 12,749, Dec. 22, 1986, abandoned, which is a continuation of Ser. No. 666,942, Oct. 31, 1984, abandoned.

[51] Int. Cl.[4] .................... H01L 29/04; H01L 27/12; H01L 49/02
[52] U.S. Cl. .......................................... 357/4; 357/35; 357/49; 357/59
[58] Field of Search ................... 357/4, 35, 49, 59

[56] References Cited

U.S. PATENT DOCUMENTS

| | | | |
|---|---|---|---|
| 3,791,024 | 2/1974 | Boleky, III | 357/23.7 |
| 3,919,005 | 11/1975 | Schinella et al. | 357/34 |
| 3,919,060 | 11/1975 | Pogge et al. | 357/49 |
| 3,944,447 | 3/1976 | Magdo et al. | 357/49 |
| 4,050,965 | 9/1977 | Ipri et al. | 357/23.7 |
| 4,106,045 | 8/1978 | Nishi | 357/23.7 |
| 4,131,909 | 12/1978 | Matsuda et al. | 357/23.7 |
| 4,447,823 | 5/1984 | Maeguchi et al. | 357/23.7 |
| 4,507,846 | 4/1985 | Ohno | 357/42 |
| 4,522,682 | 6/1985 | Soclof | 357/35 |
| 4,527,181 | 7/1985 | Sasaki | 357/23.7 |
| 4,533,934 | 8/1985 | Smith | 357/23.7 |
| 4,580,331 | 4/1986 | Soclof | 357/35 |
| 4,584,762 | 4/1986 | Soclof | 357/35 |

FOREIGN PATENT DOCUMENTS

0052038   5/1982   European Pat. Off. ............. 357/35

OTHER PUBLICATIONS

Ning et al., *IBM TDB* vol. 26 No. 11 4/84 pp. 5858–5862 "High Performance . . . Substrate".
Yang E. S. *Fundamentals of Semiconductor Devices* pp. 239–241 McGraw Hill.
A. S. Grove "*Physics and Tech. of Semiconductor Devices*" pp. 224–227 Wiley.
M. Rodder, et al., *Silicon-on-Insulator Bipolar Transistors*, vol. EDL-4, No. 6, Jun. 1983, IEEE.
R. Zuleeg, et al., *Thin-Film Lateral Bipolar Transistor in Silicon-on-Sapphire Structure*, vol. 3, No. 4, Apr. 1967, Electronic Letters.
F. P. Heiman, et al., *Silicon-on-Sapphire Epitaxial Bipolar Transistors*, vol. 11, pp. 411–418, 1968, Solid-State Electronics.
B-Y. Tsaur, et al., *Fully Isolated Lateral Bipolar-MOS Transistors Fabricated in Zone-Melting-Recrystallized Si Films on SiO2*, vol. EDL-4, No. 8, Aug. 83, IEEE.

*Primary Examiner*—Andrew J. James
*Assistant Examiner*—Jerome Jackson
*Attorney, Agent, or Firm*—Carlton H. Hoel; Thomas W. DeMond; Melvin Sharp

[57] ABSTRACT

A horizontal structure transistor is fabricated in a shallow epitaxial island which is completely surrounded by an insulator, such as oxide. The transistor has base and emitter regions which are diffused into the island from the same mask so that the base width is controllable and remains constant with respect to the emitter. A polysilicon base contact rests on top of the island and is isolated from the emitter and collector regions by an oxide layer. The horizontal structure transistor can easily be fabricated to include complementary bipolar transistors and complementary IGFET devices on the same substrate.

7 Claims, 8 Drawing Sheets

HORIZONTAL STRUCTURE THIN FILM TRANSISTOR

This application is a continuation of application Ser. No. 07/012,749, filed Dec. 12, 1986, now abandoned, which is a continuation of application Ser. No. 06/666,942, filed Oct. 31, 1984, now abandoned.

BACKGROUND AND SUMMARY OF THE INVENTION

This invention relates generally to transistors and integrated circuits and more specifically to a horizontal structure transistor and method for making same.

It would be desirable for a bipolar transistor structure to easily lend itself to the fabrication of true complementary bipolar transistors. It would further be desirable that a process for fabricating such complementary bipolar structure be compatible with the fabrication of insulated gate field effect transistor (IGFET) structures on the same substrate. Further desirable features of bipolar transistors would include small size, easy automated layout by design automation tools, complete, improved isolation, and fast switching speeds.

Presently available transistor structures have several important inherent drawbacks. It is presently possible to make efficient, high gain vertical NPN transistors, but generally difficult or impossible to fabricate complementary PNP transistors having matching characteristics on the same substrate. Generally, when PNP transistors are desired on the same substrate as vertical NPN transistors, lateral PNP transistors are fabricated. It is well known that such PNP transistors are not truly complementary with vertical NPN transistors, and have several inherent limitations such as speed and gain. Additionally, even the relatively efficient vertical NPN transistors are wasteful of real estate on the semiconductor wafer, are difficult to isolate completely, and incorporate a number of undesired parasitic capacitances.

Additionally, it is presently difficult to fabricate bipolar and IGFET devices on the same substrate. To include IGFET devices on a single substrate with bipolar devices generally involves greatly increasing the number of process steps required, thereby decreasing yield and increasing cost.

It would be desirable for a transistor structure to overcome these and other limitations of the prior art. It would therefore be desirable for a new transistor structure to be small, easily susceptible to automated layout techniques, and have a process which is amenable to the incorporation of IGFET devices on the same substrate. Further desirable features of such a transistor structure include high gain, complete isolation, and low parasitic capacitance. Such features would result in vastly improved circuit switching speeds. It would further be desirable that the current carrying capacity of the transistor be easily controllable. Yet another important feature of such an improved transistor structure would be the ability to easily fabricate true complementary NPN and PNP bipolar transistors.

Therefore, an improved transistor according to the present invention consists of a horizontal structure transistor fabricated within an epitaxial island which is completely isolated. Such isolation may be achieved by forming the island on top of an an insulator, or within a layer of insulating material. The epitaxial island is completely surrounded by insulator. The isolated epitaxial islands are preferably shallow and of a regular shape, and can be extended in one dimension in order to improve the current carrying capacitry of the transistor. Horizontal transistors can be formed in such shallow epitaxial islands through suitable diffusions of base, emitter and collector regions. A polysilicon base contact rests on top of the island, and is available for contact with the remainder of the circuitry at, for example, one end of the isolated island.

Several preferred methods for fabricating such horizontal structure transistors are described below. Generally, the diffusions necessary for fabricating such transistors are compatible with the formation of IGFET devices on the same substrate, and doing so required the use of few or no extra mask steps. Fabrication of other devices, such as resistors and Schottky diodes, is also done within the isolated epitaxial islands.

Several methods for fabricating such isolated islands can be used. One preferred method involves the anodic formation of porous silicon which is then converted to silicon oxide. This process produces isolated islands of epitaxial silicon as desired, and these islands are suitable for the fabrication of transistors and other structures as described below.

The novel features which characterize the present invention are defined by the appended claims. The foregoing and other objects and advantages of the present invention will hereinafter appear, and for purposes of illustration, but not of limitation, several preferred embodiments are shown in the accompanying drawings.

DESCRIPTION OF THE PREFERRED EMBODIMENTS

Figure 1:
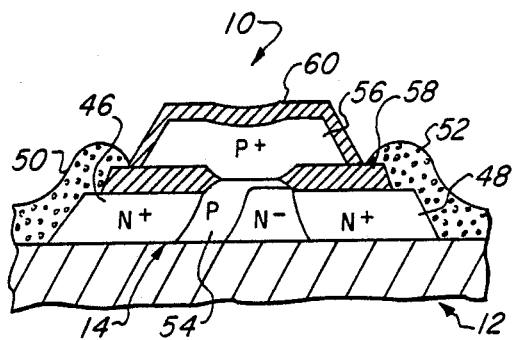
FIG. 1 is a cross-section of an NPN transistor formed in an island resting on an insulating layer.
Figure 2:
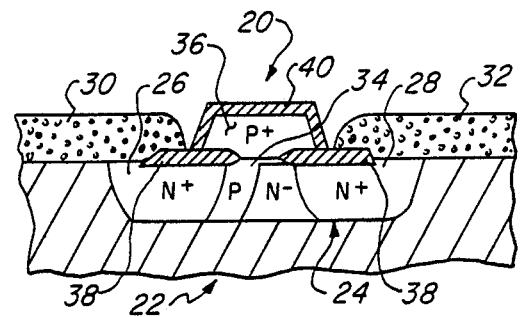
FIG. 2 is a cross-section of an NPN transistor formed in an island located within an insulating layer.

FIGS. 1 and 2 show cross-sectional views of horizontal structure transistors fabricated according to the present invention. The NPN transistor 10 of FIG. 1 has been fabricated in an epitaxial island 14 resting on an insulating layer 12. FIG. 2 shows an NPN transistor 20 which has been fabricated in an epitaxial island 24 which lies within an insulating layer 22.

Referring to FIG. 2, a horizontal structure bipolar transistor 20 is formed within an epitaxial island 24 located within an insulating layer 22. FIG. 2 shows an NPN transistor 20 located within an N-well. The insulating layer 22 is preferably silicon oxide. (hereinafter referred to simply as oxide) Highly doped N+ emitter 26 and collector 28 regions make ohmic contacts with emitter and collector leads 30,32. As shown in FIG. 2, the emitter and collector leads 30,32 are metal, but polysilicon leads also fall within the scope of the present invention.

A P-type base region 34 is adjacent to the emitter 26 and in contact with a P+ polysilicon base contact, or lead 36. The base contact 36 is separated from the collector 28 and emitter 26 by oxide layer 38, and is completely surrounded by oxide 40. The width of the base 34 is constant, providing predictable and strictly controllable device characteristics. When this structure 20 is fabricated as described below, the base width can be selected with ease, allowing one to set the gain parameters of the horizontal structure 20 transistor as desired.

The epitaxial island 24 is which the transistor 20 is formed is surrounded by oxide 22 on all sides, providing extremely good isolation from all other transistors on the same substrate, and reducing stray capacitances. The depth of the epitaxial island 24 is typically 0.5 microns so that the horizontal structure transistor 20 formed therein is extremely small. The small size of the transistor 20 and the elimination of excess sidewall capacitances results in a very fast transistor. As can be seen in FIG. 2, the horizontal structure transistor 20 is very symmetrical, which results in fast, although generally not identical, switching times in both directions.

Figure 26:
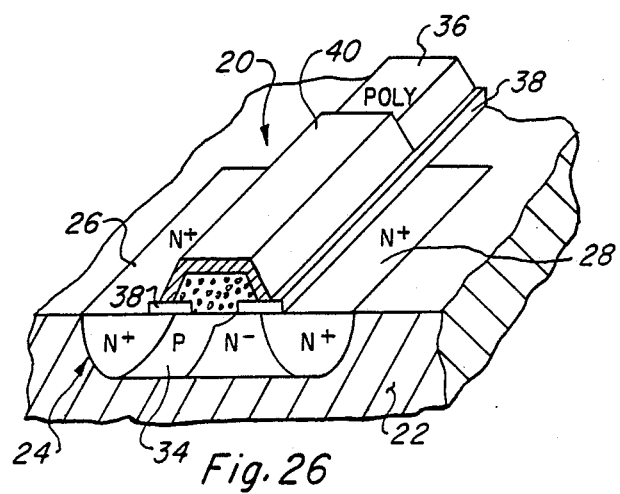
FIG. 26 is a perspective cross-sectional view of a bipolar transistor fabricated within an isolated epitaxial island, located within insulating layer, without the emitter and collector interconnects.

A perspective view of the transistor in FIG. 2 is shown in FIG. 26. Only one end of the island 24 is shown in FIG. 26, which illustrates how the polysilicon base contact 36 is carried away from the island 24 and exposed. This allows easy connection to the remainder of the circuitry on the chip. Typical dimensions for such isolated islands 24 are 10–20 microns in the direction of current flow (emitter to collector), and 50–100 microns or more in emitter and collector "length", i.e. the direction in which the base contact 36 runs. Preferred methods for forming such isolated islands 24 will be described below.

A PNP transistor has identical structure to the NPN structure shown in FIG. 2, with the conductivity type of the various regions reversed. The PNP transistor is formed in a P-type epitaxial island. Thus, the structure of the NPN and PNP bipolar transistors are substantially identical, with changes made in various dimensions to compensate for majority carrier lifetime and mobility. This results in bipolar transistors which are truly complementary in that device characteristics are accurately matched. This is an improvement over previous bipolar structures in which vertical NPN transistors are matched with lateral PNP transistors having substantially different device characteristics. Bipolar transistor structures such as shown in FIGS. 1 and 2 are not at all like present lateral PNP transistors, but are rather more closely akin to vertical NPN transistors which have been laid over on their side.

Referring to FIG. 1, an NPN transistor 10 is formed in an epitaxial island 14 which rests on top of an insulating layer 12. The insulating layer 12 is preferably silicon oxide. The structure of the horizontal transistor 10 is very similar to that of FIG. 2, in that highly doped N+ emitter 46 and collector 48 regions are located at the sides of an N-type epitaxial island 14. A P-type base 54 is adjacent to the emitter 46, and a polysilicon P+ base contact 56 is located on top of the island 14 and separated from the emitter 46 and collector 48 regions by oxide layers 58, and covered by another oxide layer 60. Emitter and collector contacts 50,52, which in this case are metallic contacts, connect to the emitter 46 and collector 48 respectively and lie on the surface of the insulating layer 12.

Figure 40:
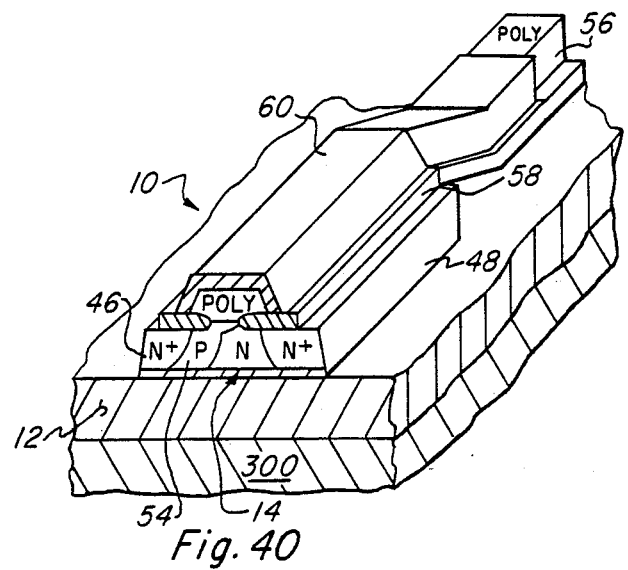
FIG. 40 shows a perspective cross-sectional view of a horizontal bipolar transistor fabricated within an epitaxial island resting on an insulating layer.

A PNP structure (not shown) similar to the NPN transistor 10 of FIG. 1 can be used to form a complementary transistor with the NPN device 10. The structure of FIG. 1, like that of FIG. 2, results in compact devices and high switching speeds. A perspective view of the device of FIG. 1 is shown in FIG. 40, which illustrates the polysilicon base contact 56 being carried to the side and exposed to allow contact with the remainder of the circuitry. The emitter and collector leads 50,52 are not shown in FIG. 40.

The device structures of both FIGS. 1 and 2 are very compact, allowing a high level of integration on the substrate. In addition, they are both rectangular in shape, which allows the use of design automation techniques to lay out device placement and connector routing. This allows high quality bipolar devices to be designed with minimum chip area, minimum cost and short lead times.

Referring to FIGS. 3–12, a preferred method for fabricating complementary horizontal structure transistors of the type shown in FIG. 2 is described. Parts corresponding to those of FIG. 2 will be labeled as in FIG. 2. Various preferred values such as implant energies and dopant concentrations given in the description of this and later processes are understood to be approximate, and will be varied to control details of the process.

Figure 3:
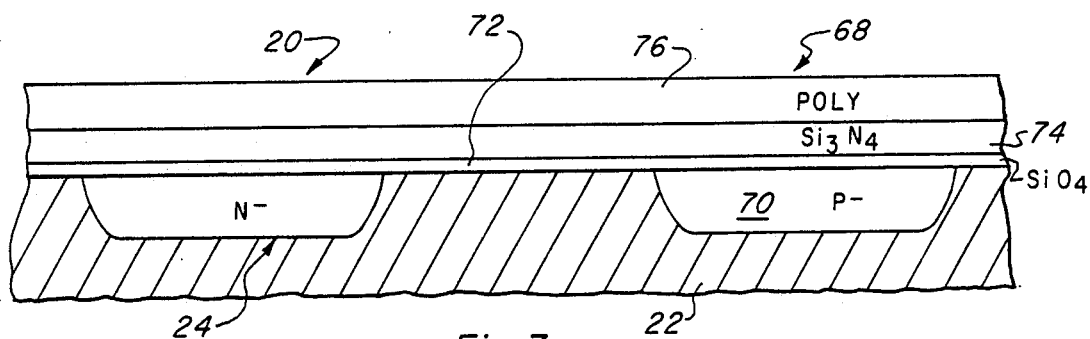
FIGS. 3–12 illustrate a preferred process for fabricating complementary bipolar transistors in epitaxial islands located within an insulating layer.

Referring to FIG. 3, N-type and P-type epitaxial islands 24,70 are formed within an insulating layer 22, preferably an oxide layer. Preferred methods for fabricating these islands 24,70 will be described later. The N-type island 24 will be used to fabricate an NPN transistor 20, and the P-type island 70 will be used for a PNP transistor 68. A thin layer of silicon oxide 72, preferably approximately 500 angstroms thick, is thermally grown over the entire surface of the wafer. The nitride layer 74, preferably approximately 1000 angstroms thick, is then deposited over the entire surface of the wafer. The nitride layer 74 is followed by approximately 2000 angstroms of polysilicon 76 deposited over the entire surface of the wafer.

Figure 4:
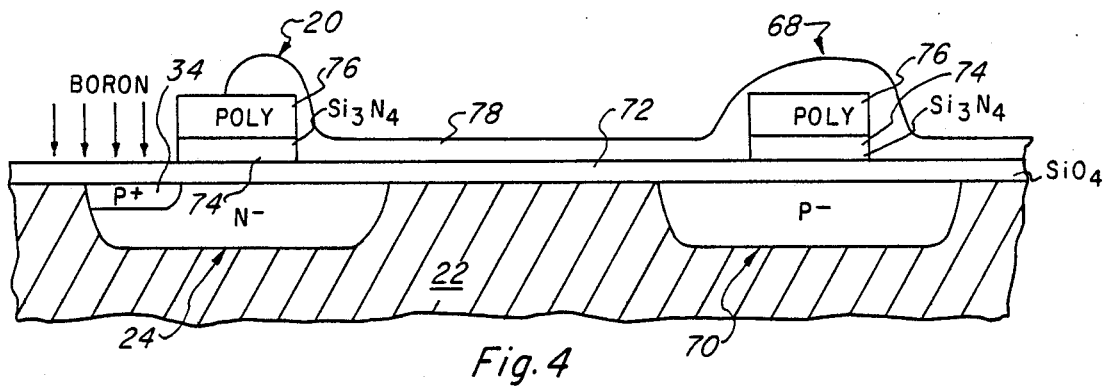

Resist (not shown) is then deposited and patterned to form a self-aligned base structure. The polysilicon and nitride layers 76,74 are then etched to conform with the resist pattern giving the stack structure shown in FIG. 4. The 500 angstrom oxide layer 72 may be left, with subsequent dopant implants being made through this layer 72, or it may be removed. The layer 72 is left in the described process. In FIG. 4, the base 34 of the NPN transistor 20 is formed by blocking the collector portion of the transistor 20 and the entire PNP transistor 68 area with resist 78. Boron is then implanted into the N-type region 24. The boron is preferably implanted at 30 KEV to form a surface dopant concentration of $2 \times 10^{13}$ atoms/cm$^2$. This implant can be annealed and diffused in at this stage, or this procedure may be delayed until the following stage. As shown in FIG. 4, the optional boron anneal is not performed now.

Figure 5:
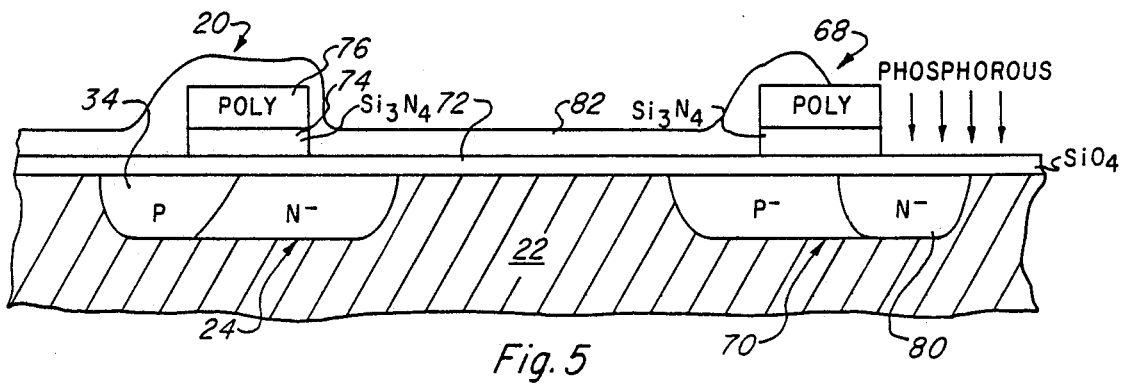

Referring to FIG. 5, the base region 80 for the PNP transistor 68 is fabricated. Resist 82 is used to cover the entire wafer except for the emitter regions of the PNP transistors 68, and phosphorous is implanted into the emitter region. The phosphorous is implanted at 70 KEV to a concentration of $2 \times 10^{13}$. At this stage, an anneal is performed with diffuses both the boron and phosphorous and forms the base regions 34,80 of both transistors 20,68.

Figure 6:
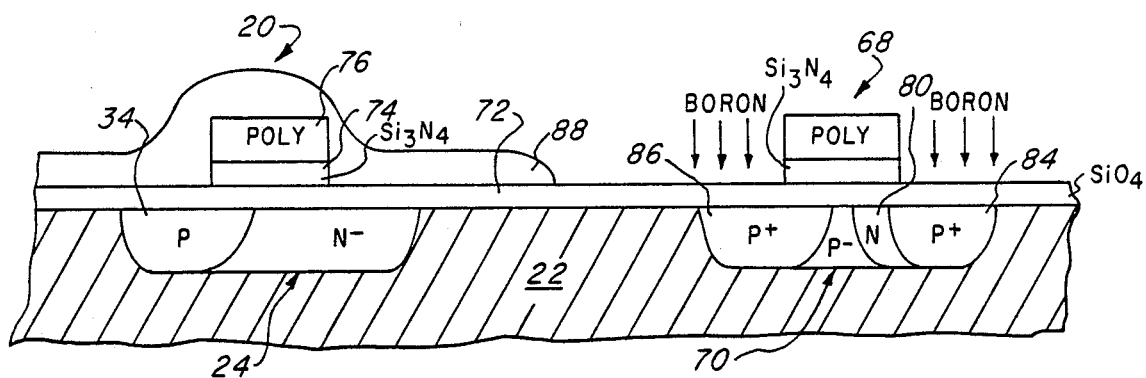

Referring to FIG. 6, the emitter and collector regions 84,86 of the PNP transistor are formed. A resist pattern 88 is used to entirely block the NPN transistors 20, and entirely expose the PNP transistors 68. Boron is implanted, preferably at 100 KEV to form a final concentration of $2 \times 10^{15}$. This implant is then annealed to form the structure shown in FIG. 6. Note that the boron implant converts the emitter region 84 to a P+ region, while leaving a smaller N-type base region 80. Since both the base and emitter regions 80,84 were implanted and then diffused, they have virtually identical profiles which results in a constant base width.

Figure 7:
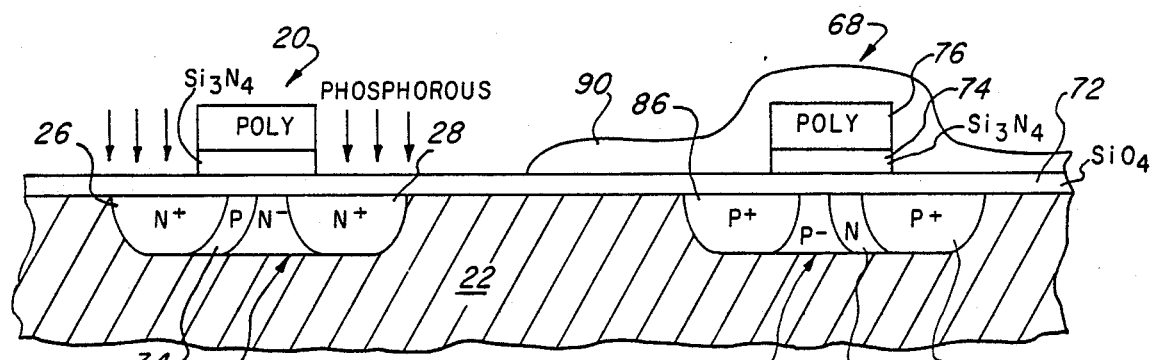

Referring now the FIG. 7, the emitter 26 and collector 28 of the NPN transistor 20 are formed. A resist pattern 90 is used to block the entire PNP transistor 68 while the entire NPN transistor 20 is exposed. Phosphorous is then implanted through the thin oxide layer 72, if it was left on the tank 24,70 surfaces, preferably at 70 KEV to a concentration of $5 \times 10^{15}$. This implant is then annealed to form the emitter and collector regions 26,28 as shown in FIG. 7. In the same manner as described with FIG. 6, the profile of the emitter and base regions 26,34 are the same, so that the base 34 has a constant width.

Figure 8:
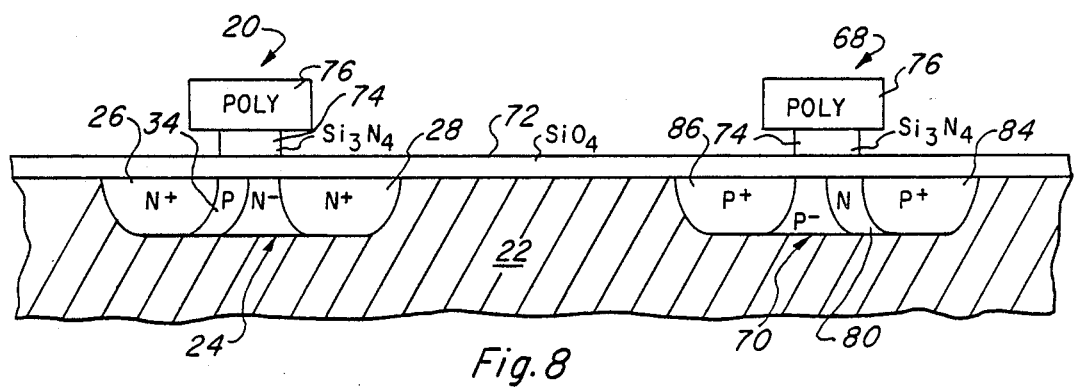

Referring to FIG. 8, the self-aligned base structures for both transistors 20,68 are formed. The nitride layer 74 remaining under the polysilicon cap 76 is undercut etched, preferably by a phosphoric/sulfuric acid mixture in the ratio of 90/10. Any etchant which etches the nitride 74 at a known rate and does not substantially effect the polysilicon cap can be used. The nitride 74 is etched back for a preselected distance by controlling the etch time.

Figure 9:
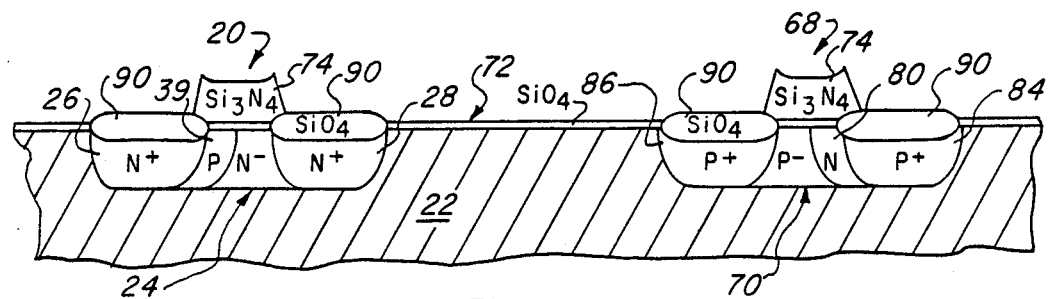

Referring to FIG. 9, the polysilicon cap 76 is stripped, and the wafer oxidized to a depth of approximately 2500 angstroms. As shown in FIG. 9, the oxide 90 over the emitters and collectors grows under the remaining nitride 74, thus isolating the emitter 26,84 and collector 28,86 regions from the area where the base contact will be formed. It is important that the nitride layer 74 be etched back precisely a preselected distance, so that oxide 90 will isolate the emitters 26,84 and collectors 28,86 without entirely covering the base regions 34,80. Since the base regions 34,80 are typically 0.25 micron across, the under etch of the nitride 74 must be carefully controlled.

The nitride 74 is then stripped, and a 500 angstrom oxide deglaze is performed. This removes the thin oxide layer 72 from above the base contact regions, while leaving oxide 90 above the emitter and collector regions 26,28,84,86. This results in the structure of FIG. 10.

Figure 10:
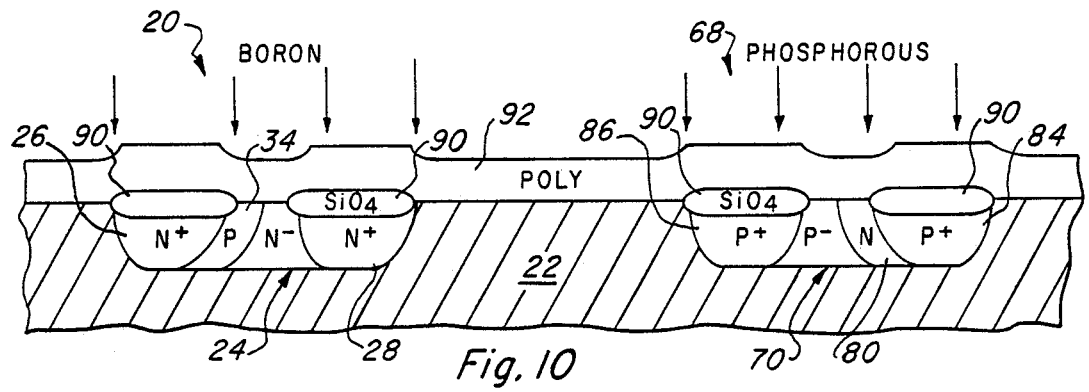

Referring to FIG. 10, a layer of polysilicon 92 is deposited over the entire wafer in order to form base contacts for both horizontal structures. A resist block (not shown) is patterned to cover the entire PNP transistor 68, and boron is implanted, preferably at 100 KEV to a concentration of $5 \times 10^{15}$, in order to form P-type polysilicon for the base contact. A resist block (not shown) is then patterned to cover the entire NPN transistor 20, and phosphorous is implanted, preferably at 70 KEV to a concentration of $5 \times 10^{15}$, in order to make an N-ype base contact. An optional metal silicide layer, such as titanium or platinum silicide, can be formed at this point by depositing such metal over the polysilicon 92 and annealing. This layer greatly reduces sheet resistances within the base contacts. Such reduction can be important when long polysilicon base contacts 36,96 are used. No silicide layer is shown in FIG. 10.

Figure 11:
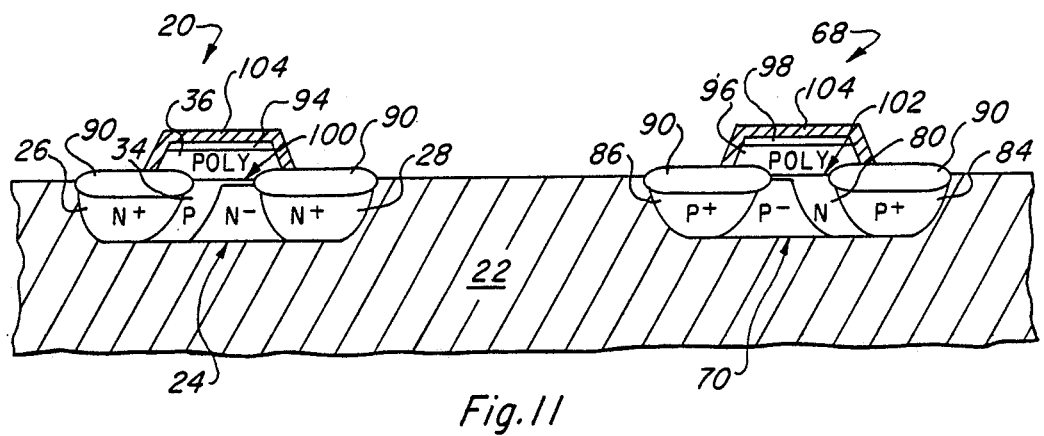

Referring to FIG. 11, the polysilicon 92 and optional silicide layers are patterned and etched to form the base regions shown in FIG. 11. This gives a P-type polysilicon base contact 36 with a silicide layer 94, and an N-type polysilicon base contact 96 with a silicide layer 98. The polysilicon and silicide layers 36,94,96,98 are then oxidized in order to completely isolate the base contacts 36,96 with oxide layers 104. In the preferred embodiment, a thin native oxide is grown over the contacts 36,96, followed by a thicker deposited oxide. This prevents large portions of the contacts 36,96 and silicide layers 94,98 from being converted to oxide. At this point, impurities from within the polysilicon base contacts 36,96 diffuse into the thin uppermost layer of the epitaxial islands 24,70 as shown.

Figure 12:
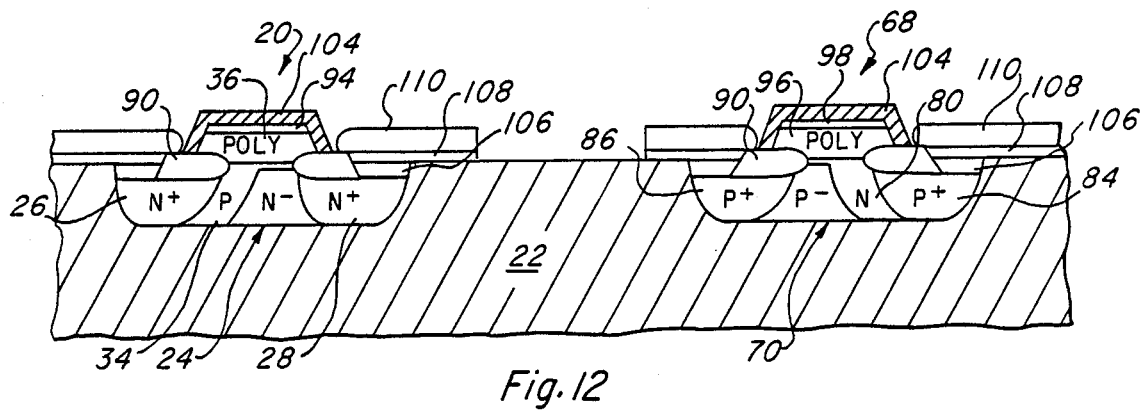

Referring to FIG. 12, contacts are then made to the emitters 26,84 and collectors 28,86 of both NPN and PNP transistors 20,68. Oxide 90 is removed from the contact regions, and platinum silicide 106 formed in order to form an ohmic contact. A layer of titanium tungsten 108 is deposited, followed by a layer of aluminum 110. The titanium tungsten and aluminum layers 108,110 are then patterned in order to form a first layer of metallization on the wafer. Although it is preferred to usse platinum silicide and titanium tungsten-/aluminum emitter and collector contacts, other methods are known in the art and can be used instead. Variations on the fabrication method described above will become apparent to those skilled in the art. For example, it may be desirable to have only NPN bipolar transistors on a device. The method described above can be used, with those processing steps directed to fabricating PNP devices left out. This would reduce the total number of processing steps required so that an NPN only device is very simply fabricated.

Figure 41:
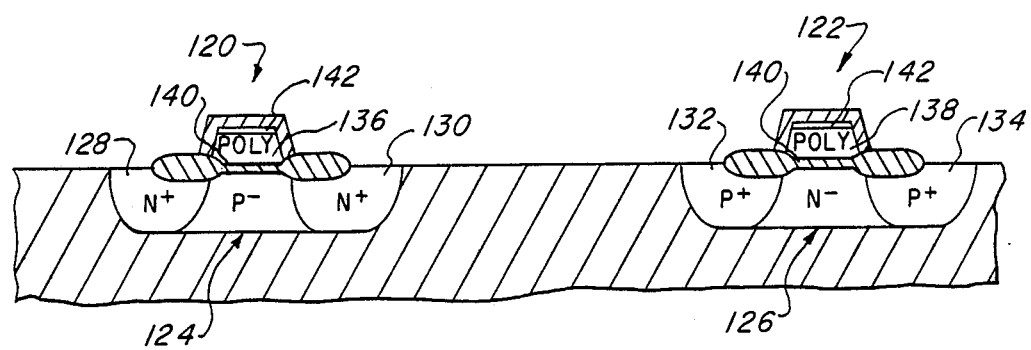
FIG. 41 shows a cross-sectional view of complementary IGFET devices formed in isolated epitaxial islands located within an insulating layer.

In addition, it will be apparent to those skilled in the art that the processing method described above is compatible with the formation of IGFET devices on the same substrate as the bipolar devices. In general terms, in order to adapt the bipolar method to produce IGFET devices, it is necessary only to eliminate the base implant and diffusion steps shown in FIGS. 4 and 5, and to form a gate oxide layer between the polysilicon contact and the central region of the isolated island. An example of this is shown in FIG. 41, where complementary n-channel 120 and p-channel 122 transistors are shown fabricated in isolated islands 124,126 of the type used for the complementary bipolar transistors 20,6e. These are simplified cross-sections, showing only the n-channel source and drain regions 128,130, the p-channel source and drain regions 132,134, and the polysilicon gates 136,138. The polysilicon gates 136,138 are separated from the epitaxial islands 124,126 by a thin gate oxide 140 which can be grown using one additional mask step. After the 500 angstrom oxide deglaze is performed as described in connection with FIG. 10, a thin gate oxide, preferably 500 angstoms, is grown over the IGFET gate regions. The source and drain regions 128,130,132,134 can be formed simultaneously with the emitter and collector regions 26,28,84,86 of the respective bipolar transistors 20,68 as shown in FIGS. 6 and 7. The polysilicon gates 136,138, which as shown in FIG. 41 include a silicide layer 142 in order to reduce sheet resistance, are formed at the same time as the polysilicon base contacts 36,96 for the bipolar transistors. Substrate contacts are not shown in FIG. 41, but can be made in a manner similar to the bipolar transistor base contacts and projecting from the end of the epitaxial islands 124,126 opposite the polysilicon gate contacts 136,138. The gate contacts 136,138 extend beyond one end of the epitaxial islands 124,126 for connection to the remainder of the circuit on the wafer in the same manner as shown in FIG. 26 for the bipolar case.

In actual practice, it will usually be desirable to fabricate the IGFET devices using well known techniques, such as self-aligned gates. This would generally involve extra mask steps, with all bipolar devices being completely masked out during the additional process steps. Fabrication methods suitable for use in isolated epitaxial islands of the type described herein will become apparent to those skilled in the art.

Figure 13:
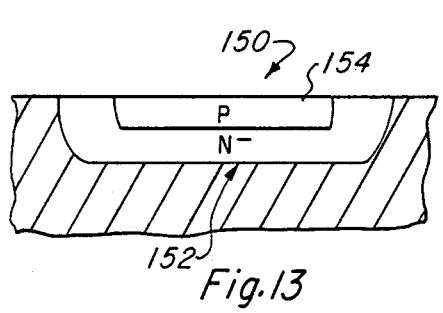
FIGS. 13–15 illustrate one preferred method of fabricating resistors within isolated epitaxial islands.
Figure 14:
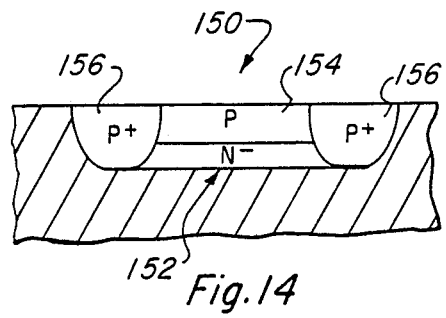
Figure 15:
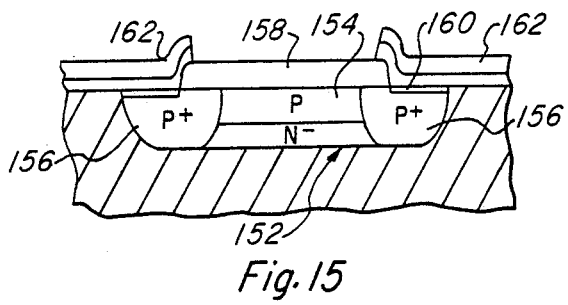

FIGS. 13-15 show one preferred method for forming resistors 150 in isolated islands 152. This process is illustrated by implanting a p-type resistor 150 in an n-type epitaxial island 152, but the conductivity types may be reversed if preferred. Referring to FIG. 13, a resistor channel region 154 is implanted and annealed at the same time as the boron base implant of FIG. 4. This region can run the length of the epitaxial island 152, or across the width of the epitaxial island 152 if extremely low resistances are desired. Referring to FIG. 14, P= contact regions 156 are formed by implanting and annealing boron during the same step as the formation of the emitter and collector regions 84,86 of the PNP transistor 68 as shown in FIG. 6. The contacts 156 will generally be formed on the ends of the epitaxial island 152, so that the resistor 150 runs along the length of the island 152. The resistor 150 is masked from all other process steps except for the oxide growth of FIG. 9, and the metallization formation of FIG. 12. This results in a resistor having a layer of oxide 158, and as shown in FIG. 15, platinum silicide contact regions 160 and titanium tungsten/aluminum metallic contacts 162. The processing steps of FIGS. 13-15 are compatible with the formation of complementary bipolar transistors 20,68 inasmuch as it utilizes the base implant for the NPN transistor 20 and the emitter/collector implant for the PNP transistor 68. If it is desired to fabricate only NPN transistors, the emitter/collector implant for the PNP transistor will not be used, and an alternative resistor formation process must be used.

Figure 16:
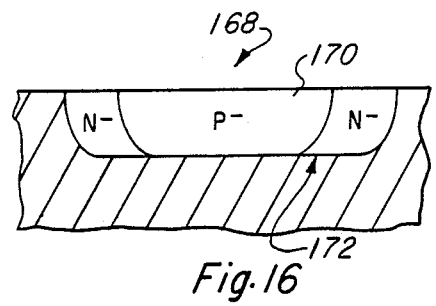
FIGS. 16–18 illustrate a second preferred method for fabricating transistors within isolated epitaxial islands.
Figure 17:
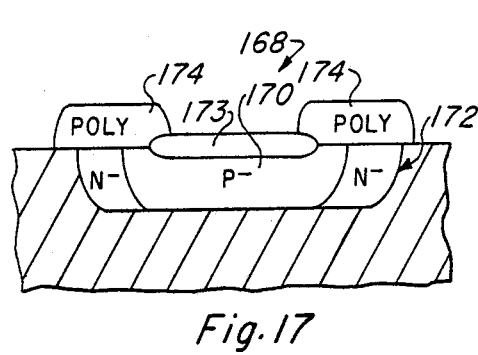
Figure 18:
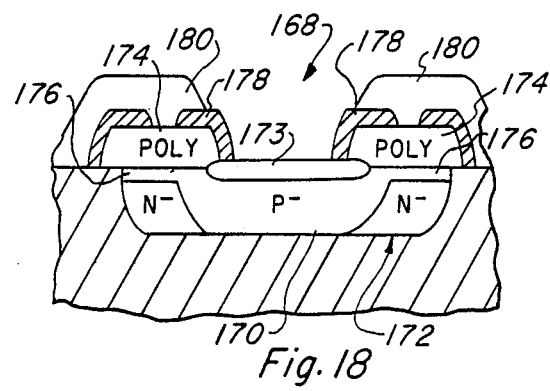

Referring to FIGS. 16-18, such an alternative process for resistor 168 formation, suitable for use when only NPN horizontal structure transistors 20 are to be formed, is shown. A p-type region 170 is implanted into an n-type island 172 in a manner similar to that of FIG. 13. Referring to FIG. 17, the resistor island 172 is then masked from all further process steps, except for the growth of an oxide layer 173, until the polysilicon base contacts 36 are formed. At that time, any oxide overlying the contact regions of the resistor 168 is removed, and polysilicon resistor leads 174 are fashioned and implanted with boron as described in connection with FIG. 10. The leads 174 are then patterned, and subsequent annealing steps cause the entire contact region 176 to become p-type, thereby resulting in a resistor 168 running the length of the epitaxial island 172. This is shown in FIG. 18. The polysilicon contacts 174 are oxidized along with the base contacts as described in connection with FIG. 11, forming oxide isolation layer 178. These polysilicon contacts 174 may be run and coupled directly to another device, for example, the base contact of a transistor 20, or the oxide layer 178 may be opened as shown in FIG. 18 and metallic contacts 180 attached thereto.

It will be apparent to those skilled in the art that the conductivity type of the island 172 can be reversed if desired, requiring oppositely doped polysilicon contacts 174.

Figure 19:
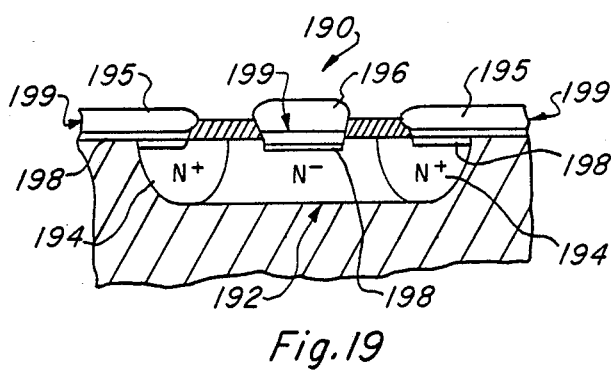
FIG. 19 shows a Schottky-barrier diode fabricated within an isolated epitaxial island.

Due to the extremely small size of complementary bipolar transistors fabricated as described above, Schottky transistors are difficult to make. It is preferable to fabricate Schottky diodes in separately isolated islands if such are desired. FIG. 19 shows a Schottky diode structure 190 compatible with the present method of transistor construction. In FIG. 19, an n-type epitaxial island 192 is utilized, and is blocked from all processing steps except that used to form the emitter and collector of the NPN transistors. Phosphorous is implanted at the same time as the emitter and collector of FIG. 7, and annealed to form ohmic contact region 194. The only additional processing step needed is the formation of ohmic contacts 195 and a metallic schottky contact 196 as shown. The contacts 195,196 of FIG. 19 all include platinum silicide 198, and titanium tungsten/aluminum metal 199. The structure of FIG.19 shows two Schottky diodes having a common anode.

Referring to FIGS. 20-25, a preferred alternative method for fabricating horizontal structure transistors of the type shown in FIG. 2 is described. In these figures, only an NPN bipolar structure 200 will be described.

Figure 20:
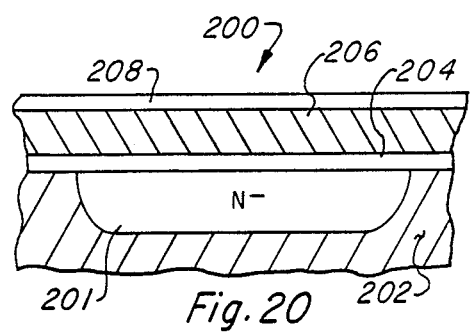
FIGS. 20–25 illustrate a preferred alternative process for fabricating bipolar transistors in isolated epitaxial islands located within an insulating layer.

Referring to FIG. 20, an n-type epitaxial island 201 is formed of an insulating layer 202 of oxide. A thin layer of oxide 204, preferably approximately 1000-2000 angstroms thick, is grown over the surface of the substrate. An oxidation resistant mask 206, such as silicon nitride, is formed over the oxide layer 204 to a depth of preferably about 2000 angstroms. Another thin oxide layer 208 is formed over the nitride layer 206. The important feature of these three layers 204,206,208 is that the center layer 206 of this three-layer sandwich is etched by materials which do not substantially affect the top and bottom layers 204,208. The reason for this will become apparent.

Figure 21:
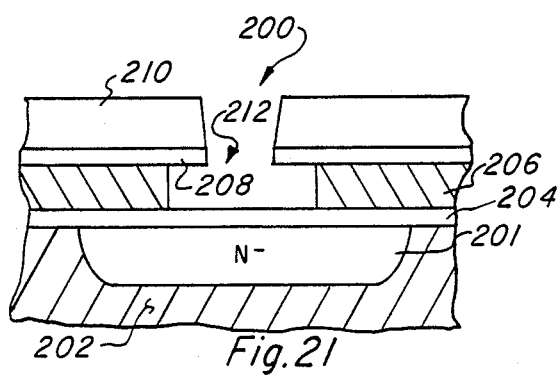

Referring to FIG. 21, a layer of resist 210 is deposited and patterned to define an opening 212 over the center of the epitaxial island 201. The top layer of oxide 208 is then etched to conform to this pattern, and a wet etch used to remove the nitride layer 206. The nitride layer 206 is over etched to create a larger opening than in the top oxide layer 208 as shown in FIG. 21. This distance should be precisely controlled in order that the subsequent polysilicon base region to be formed in this area is properly aligned.

Figure 22:
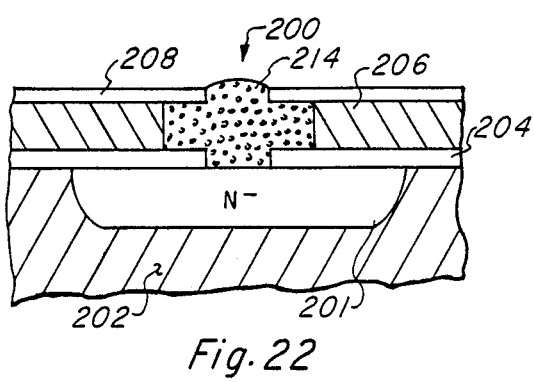

Referring to FIG. 22, the bottom oxide layer 204 is etched to reproduce the pattern in the top oxide layer 208. This can be accomplished by a suitable plasma etch. The resist layer 210 is then removed. The spaces thus formed in the nitride and oxide layers 204,206,208 are now filled with polysilicon 214 or polysilicon/partial epitaxial silicon. Using known techniques in an AMT 7800 reactor, single crystal epi will grow on the substrate contact, with polysilicon growing from the nitride 206 walls.

Figure 23:
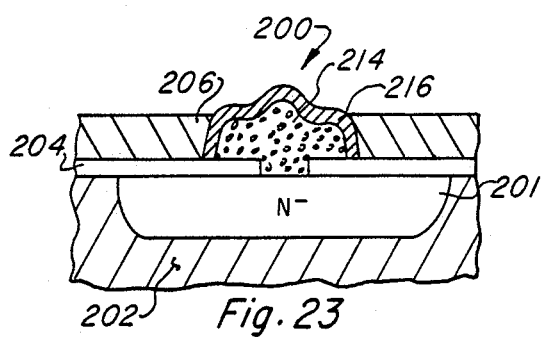

Referring to FIG. 23, the top oxide layer 208 is removed and the polysilicon region 214, which is to become the base contact, is doped by diffusion or implant. An oxide layer 216 is then grown on the polysilicon 214, and this oxide layer 216 is preferably thicker than the lower oxide layer 204.

Figure 24:
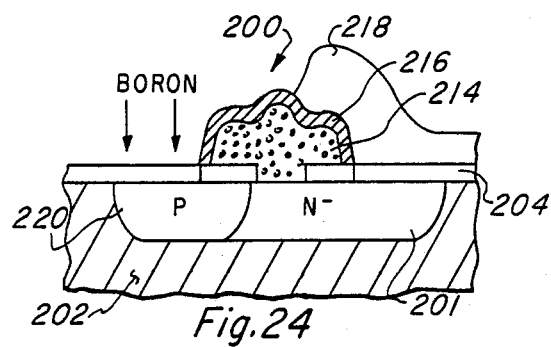

Referring to FIG. 24, the nitride 206 is stripped, and the exposed portions of the lower oxide layer 204 removed. Since the polysilicon oxide 216 is thicker than this lower oxide 204, no masking is necessary for this step. Resist 218 is then used as a block, and boron implanted and annealed in order to define a base region 220 as described in connection with the first preferred fabrication method shown in FIGS. 3-12.

Figure 25:
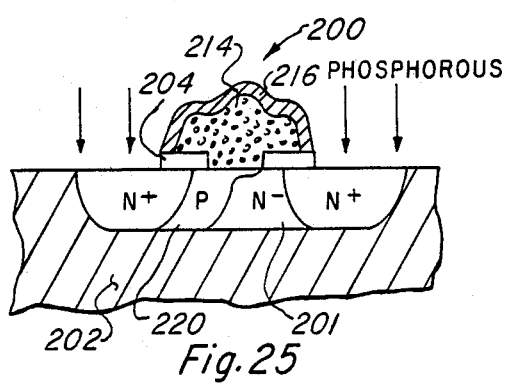

Referring to FIG. 25, phosphorous is then implanted and annealed in order to form emitter 222 and collector 224 regions. The structrue of the transistor 200 is now substantially the same as that of FIG. 2, and is now ready for metallization.

Figure 27:
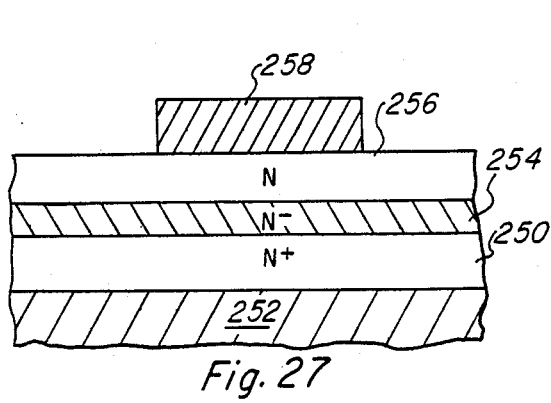
FIGS. 27–29 illustrate a preferred method for forming isolated epitaxial islands within an insulating layer.
Figure 28:
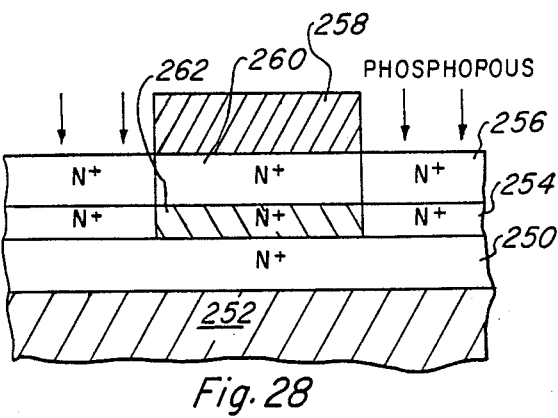
Figure 29:
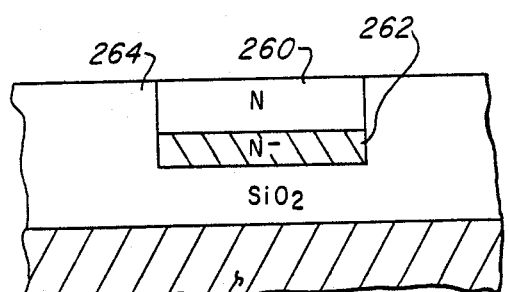

Isolated epitaxial islands suitable for use with the fabrication of bipolar and IGFET transistors, as described in the above processes, can be formed in several ways. One preferred method is illustrated in FIGS. 27-29. Referring to FIG. 27, a first N+ epitaxial layer 250 is grown on a silicon substrate 252. An optional second epitaxial layer 254, having a much lower dopant concentration than the first layer 250 is then grown. The preferred method includes this layer 250 as shown. Inclusion of this layer 254, which can be virtually undoped, creates an abrupt junction with layer 250, which improves the oxidation described below. A third epitaxial layer 256 having a concentration between that of the first and second layers 250,254 is then grown. This third epitaxial layer 256 will eventually form the epitaxial islands in which devices will be fabricated. A layer of silicon nitride 258 is then formed over the third epitaxial layer 256 and patterned as shown in FIG. 27.

Referring to FIG. 28, a high energy phosphorous implant is made to convert the second and third epitaxial layers 254,256 to highly doped N=of a concentration substantially equal to that of the first epitaxial layer 250. The only areas not converted are those defined by the nitride mask 258. The resulting structure is basically an island of moderately n-type material 260, with a thin layer of very lightly doped n-type material 262 below it. Surrounding this island on all sides is highly doped n-type epitaxial material 250,254,256.

The substrate as shown in FIG. 28 is now ready for anodization in order to convert the highly doped N+ regions to porous silicon, which is then converted to silicon oxide. Such a process and mechanism for performing this conversion is described in the article "Complete Dielectric Isolation By Highly Selective and Self-Stopping Formation of Oxidized Porous Silicon" by R. P. Holmstrom and J. Y. Chi, published in Applied Physics Letters, Volume 42, No. 4, Feb. 15, 1983 and in co-pending U.S. patent application filed, and assigned to the assignee of the present application, which copending application is herein incorporated by reference.

Referring to FIG. 29, anodization in HF and subsequent oxidation of the porous silicon thus formed coverts the N+ layers to oxide 264. This results in an n-type epitaxial tank 260, riding atop a very thin n-type region 262, the size of which is exaggerated in FIG. 29, surrounded on all sides by silicon oxide 264.

Figure 30:
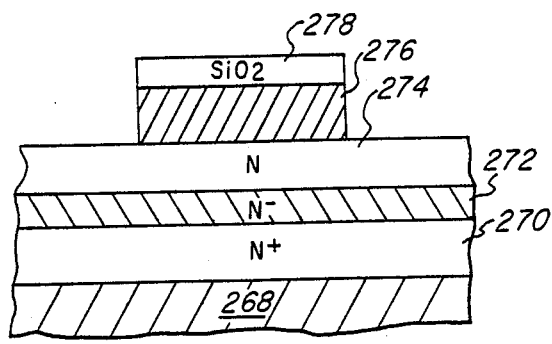
FIG. 30–32 illustrate a preferred alternative method for forming isolated epitaxial islands within an insulating layer.
Figure 31:
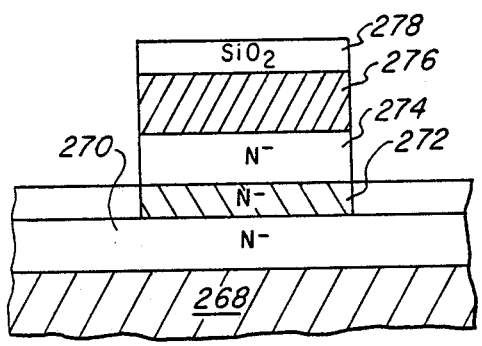
Figure 32:
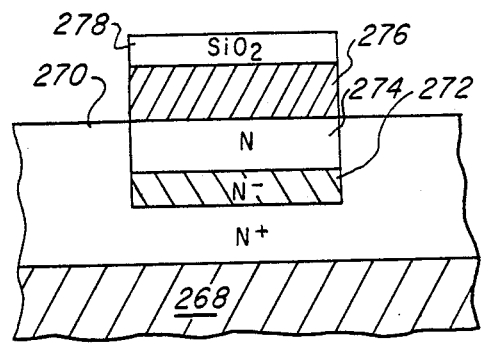

Another method for forming isolated islands is shown in FIGS. 30-32. First 270, second 272 and third 274 doped epitaxial layers are formed on a substrate 268 as described in FIG. 27. A nitride layer 26 is then deposited, followed by an oxide layer 278. The oxide and nitride layers 278,276 are then patterned. The purpose of the oxide layer 276 is to minimize the number of polysilicon nucleation sites in a later selective epitaxial growth step as described in connection with FIG. 32.

Referring to FIG. 31, the patterned oxide 278 and nitride 276 act as a mask, and the exposed portions of the moderately doped 274 and very lightly doped 272 epitaxial layers are etched away.

Referring to FIG. 32, highly doped epitaxial silicon, preferably having a dopant concentration identical with that of the first epitaxial layer 270, is then selectively grown in order to surround the moderately and lightly doped island are 274,272 with highly doped N+ epitaxial silicon 270. This results in the structure of FIG. 32. This structure can now be anodized and oxidized as described above to result in the isolated epi island shown in FIG. 29.

The alternative processes described above result in N-type epitaxial islands 260,274 surrounded by an oxide insulating layer 264. P-type islands can be formed by diffusing or implanting and annealing boron into the n-type island 260 or 274 after the anodization step. Since the boron will not diffuse through the surrounding oxide 264, mask alignment and annealing times are not critical.

In another embodiment of the present invention, it is possible to form horizontal structure transistors in an exposed island which rests on top of an insulating layer rather than being formed within the insulating layer. Such a process for forming the horizontal structure transistor 10 of FIG. 1 will be described in connection with FIGS. 33-39. FIG. 40 shows a perspective view of the structure formed by this process.

Figure 33:
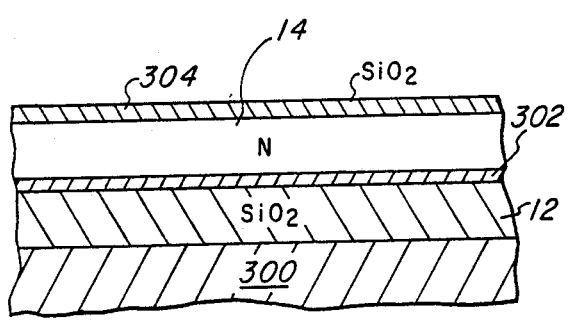
FIGS. 33–39 illustrate a preferred method for forming bipolar transistors in an epitaxial island resting on top of an insulating layer.

Referring to FIG. 33, oxygen is implanted in a <100> substrate 300, preferably at 200 KEV to a concentration of $1 \times 10^{18}$. Annealing this implant forms the silicon oxide insulating layer 12, and leaves a thin substrate layer 302 above this. This substrate layer 302 can be used to grow epitaxial silicon. An epitaxial layer 14, preferably approximately 0.6 microns deep and with a resistance of 0.3 ohm-cm, is then grown on the exposed substrate 302. This epi layer 14 is then oxidized to form an oxidized layer 304 which is preferably 1000 angstrom thick.

Figure 34:
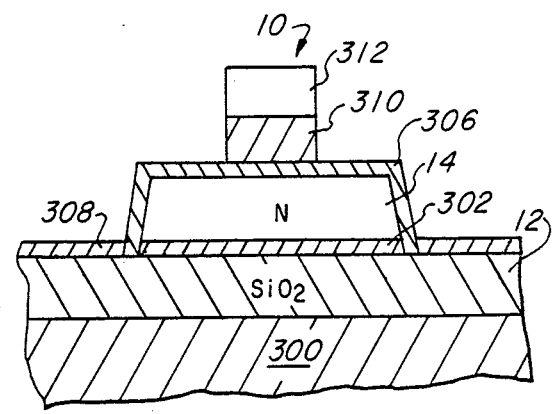

Referring to FIG. 34, the epitaxial layer 14 is patterned and etched in order to form an epitaxial island 14 resting upon the insulating layer 302. The thin oxide 304 is rirst removed, and the silicon 14 is removed using an orientation dependent etch. The oxide 304 remaining over the epitaxial island 14 is then deglazed.

An alternative processing step at this stage would be to etch epi layer 14 only halfway to the oxide layer 12. This step would then be followed by oxidation of the exposed epi, which expands to form a level surface with the unoxidized epitaxial island 4. This results in an epitaxial island which is surrounded on all sides by an insulating layer of oxide, such as the island 24,70 shown in FIG. 3. If this alternative processing step is elected, processing is preferably completed in accordance with the method of FIGS. 3-12.

Referring again to FIG. 34, a thin oxide layer 306 is then grown to a thickness of approximately 500 angstroms. This will completely surround the epitaxial island 14 with oxide 306, and convert the exposed portions of the substrate to a thin oxide layer 308. 1000 angstroms of nitride 310, followed by 2000 angstroms of polysilicon 312, are then deposited and patterned to define the base region of the transistor 10. This gives the structure of FIG. 34.

Figure 35:
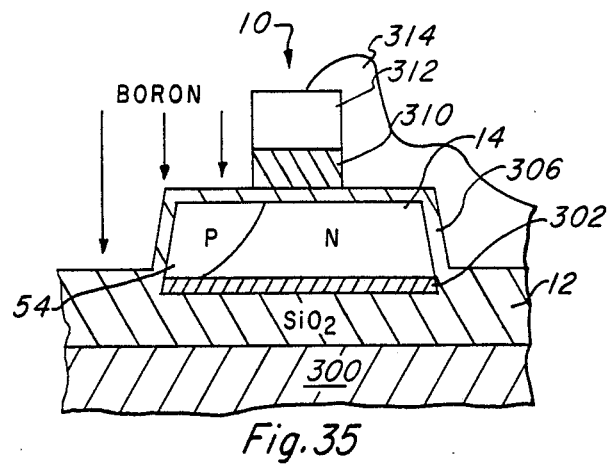

Referring to FIG. 35, resist 314 is patterned to block the collector and allow a base implant. Boron is implanted, preferably at 80 KEV to a concentration of $1 \times 10^{14}$, and the annealed at 1000° C. for 30 minutes in an inert atmosphere such as nitrogen to form base region 54. This results in the structure of FIG. 35.

Figure 36:
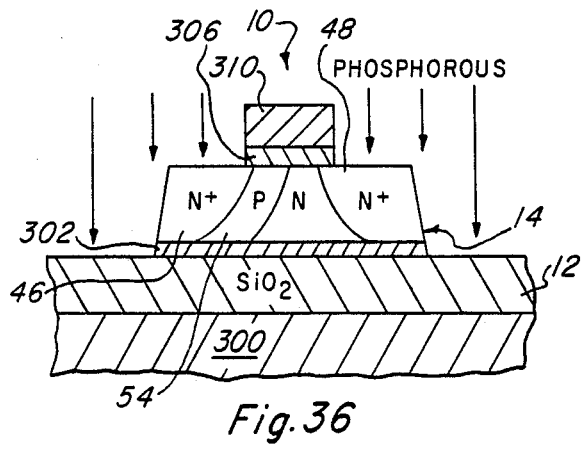
Figure 37:
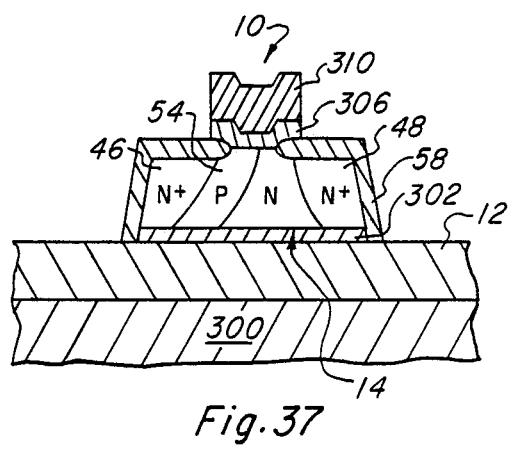

Referring to FIG. 36, the resist 314 is removed, and an oxide deglaze performed. This removes oxide layer 312, and that portion of layer 306 not covered by the nitride 310. Phosphorous is then implanted, preferably at 70 KEV, to a concentration of $5 \times 10^{15}$. This forms emitter 46 and collector 48 regions. Referring to FIG. 37, the phosphorous is annealed and oxidized at 900° C. for 30 minutes in stream. This results in approximately 2500 angstroms of oxide 58 in the exposed areas. The oxide 58 grows under the nitride block 310 to a certain extent, as shown in FIG. 37.

Figure 38:
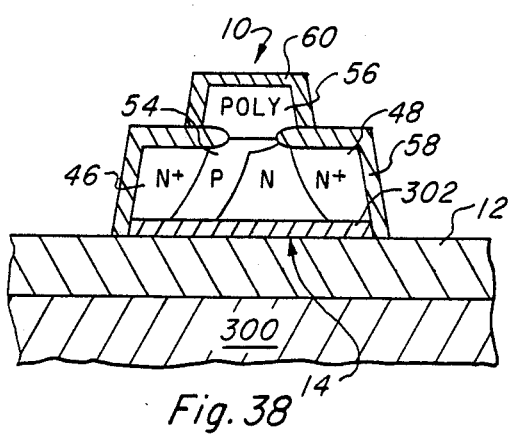

Referring to FIG. 38, the nitride 310 is removed and a 500 angstrom oxide deglaze performed to expose the base region 54 of the transistor 10. The extra thickness of the oxide 58 allows this to be done in an unmasked operation. 4000 angstroms of polysilicon is then deposited over the entire surface of the wafer. Boron is implanted, preferably at 100 KEV to a concentration of $1 \times 10^{15}$, and the polysilicon is patterned and etched to form the base contact 56. Thirty minutes of oxidation in stream at 900° C. is then performed to isolate the base contact 56 in oxide 60, giving the structure of FIG. 38.

Figure 39:
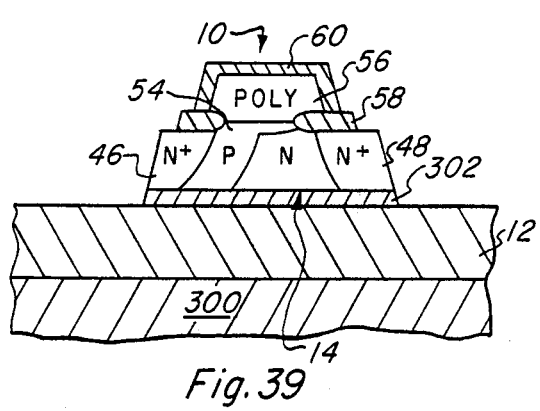

Referring to FIG. 39, the oxide 46 surrounding the raised epitaxial island 14 is then patterned and etched to expose the emitter 46 and collector 48 so that contact metallization can be applied. Platinum silicide, and titanium tungsten/aluminum are the preferred contact materials used to form the final structure shown in FIG. 1.

It will be apparent to those skilled in the art that the process for forming an NPN horizontal transistor 10 in a raised epitaxial island 14 resting on top of an insulating layer 12 is virtually the same as that used to form a horizontal transistor 20 in a sunken epitaxial island 24. It will thus become apparent that complementary bipolar horizontal structure transistors can be formed in raised epitaxial islands by adapting the process shown in FIGS. 3-12 to that shown in FIGS. 33-39.

Fabrication of integrated circuits using the methods and devices described above has many advantages over the prior art. The various components are all fabricated in regularly shaped islands of epitaxial silicon, preferably rectangular, allowing automated layout systems to work efficiently. The transistor structures are very small, resulting in fast operation and allowing a high level of integration.

Transistor efficiency and speed are improved because of several factors. Total oxide isolation reduces capacitances as does small device size. High gain and the resultant increase in switching speeds are achieved by making the base width narrow. Narrow base widths require that the width be constant in order to avoid punch-through effects. Because the base and emitter have been diffused from the same location, the leading edges of their respective diffusion regions have the same shape, resulting in constant base width. This width can be made as small as desired by reducing the base diffusion time.

The structure described above are fabricated horizontally, but have the features of vertical transistors without the drawbacks. For example, no highly doped buried layer is required in the horizontal structure transistors. Traditional vertical devices must allow for both vertical and horizontal current flow so that contact can be made with the base and collector. These contacts must be brought out to the side, and then to the surface of the wafer for connection to other devices. This is very wasteful of the real estate on the wafer, introduces large parasitic capacitances, and increases collector resistance. These problems are solved by the present invention.

It is important to note that sub-micron device features are obtained with the new method without the requirement for sub-micron lithography. Base widths of 0.2 microns are easily obtained as described above. Emitter width, an important parameter, is actually the height of the epitaxial island, and is typically 0.5 microns are described above. Current carrying capacity can be increased by simply increasing the long dimension of the epitaxial island, which is similar to the standard practice of increasing the current carrying capacity of MOS devices by increasing channel width.

The present invention has been illustrated by the methods and structures described above, and it will become apparent to those skilled in the art that various modifications and alterations may be made thereto. Such variations fall within the ambit of the present invention, the scope of which is defined by the appended claims.

What is claimed is:

1. A horizontal bipolar transistor structure, comprising:
    a substrate;
    an insulating layer covering one surface of said substrate:
    an island of epitaxial silicon of a first conductivity type located in said insulating layer and having an upper surface substantially coplanar with a surface of said insulating layer away from said substrate and a lower surface substantially parallel thereto and spaced toward said substrate, wherein said island is surrounded on all sides and below the lower surface by said insulating layer;
    a first highly doped region of the first conductivity type disposed within said island along a first side thereof, and filling the island between the upper surface and the lower surface:
    a second highly doped region of the first conductivity type disposed within said island along a second side thereof, wherein the second side is opposite the first side, and wherein the second side fills said island between the upper and lower surfaces; and
    a third region of a second conductivity type disposed adjacent said first doped region and filling the island between the upper and lower surfaces, said third region having an essentially constant width between said first and second regions and having a doping profile with a largest concentration in a direction toward the first region and a lower concentration in a direction toward the second region:

insulation means contacting a portion of said first and second regions and a portion of said third region, having a window therein over said third region, whereby direct electrical contact can be made to said third region through said window;

and means overlying said third region and a portion of said insulation means for establishing direct electrical contact to said third region through said window.

2. The horizontal bipolar transistor structure of claim 1 further comprising:
a first conductive contact directly electrically connected to said first region at the upper island surface;
and a second conductive contact directly electrically connected to said second region at the upper island surface; and
wherein said third conductive contact is directly electrically connected to said third region at the upper island surface.

3. A horizontal bipolar transistor structure, comprising:
a substrate:
an insulating layer covering one surface of said substrate and having a top surface;
an island of epitaxial silicon of a first conductivity -type located on said insulating layer top surface and having a lower surface in contact therewith, and an upper surface substantially parallel thereto and spaced away from said insulating layer:
a first highly doped region of the first conductivity type disposed within said island along a first side thereof, and filling the island between the upper surface and the lower surface;
a second highly doped region of the first conductivity type disposed within said island along a second side thereof, wherein the second side is opposite the first side, and wherein the second side fills said island between the upper and lower surfaces; and
a third region of a second conductivity type disposed adjacent said first doped region and filling the island between the upper and lower surfaces, said third region having an essentially constant width between said first and second regions; and having a doping profile with a largest concentration in a direction toward the first region and a lower concentration in a direction toward the second region;

insulation means contacting a portion of said first and second regions and a portion of said third region, having a window therein over said third region, whereby direct electrical contact can be made to said third region through said window;

and means overlying said third region and a portion of said insulation means for establishing direct electrical contact to said third region through said window.

4. The horizontal bipolar structure of claim 3 further comprising:
a first conductive contact directly electrically connected to said first region at the upper island surface;
and a second conductive contact directly electrically connected to said second region at the upper island surface; and
wherein said third conductive contact is directly electrically connected to said third region at the upper island surface.

5. A horizontal bipolar transistor, comprising:
an isolated island of epitaxial silicon, including:
first and second highly doped regions of a first conductivity type on opposite sides of said said island:
a third region of a second conductivity type between and adjacent said first and second highly doped regions, said third region having an essentially constant width between said first and second regions; and having a doping profile with a largest concentration in a direction toward the first region and a lower concentration in a direction toward the second region:

insulation means contacting a portion of said first and second regions and a portion of said third region, having a window therein over said third region, whereby direct electrical contact can be made to said third region through said window;

and means overlying said third region and a portion of said insulating means for establishing direct electrical contact to said third region through said window.

6. The horizontal bipolar transistor of claim 5 wherein said isolated of epitaxial silicon comprises a layer of insulating material and a region of epitaxial silicon in and surrounded on sides and bottom by said layer of insulating material.

7. The horizontal bipolar transistor of claim 5 wherein said isolated island of epitaxial silicon comprises a layer of insulating material and a region of epitaxial silicon upon said layer of insulating material.

* * * * *